(12) United States Patent
Lee et al.

(10) Patent No.: US 6,678,191 B2
(45) Date of Patent: Jan. 13, 2004

(54) SEMICONDUCTOR MEMORY DEVICE HAVING MEMORY CELL ARRAYS CAPABLE OF ACCOMPLISHING RANDOM ACCESS

(75) Inventors: Seung-Jae Lee, Kyonggi-do (KR); Young-Ho Lim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/165,838

(22) Filed: Jun. 6, 2002

(65) Prior Publication Data

US 2002/0186591 A1 Dec. 12, 2002

(30) Foreign Application Priority Data

Jun. 11, 2001 (KR) ........................................ 2001-32466

(51) Int. Cl.[7] .............................................. G11C 16/04
(52) U.S. Cl. ............................. 365/185.17; 365/189.01
(58) Field of Search ...................... 365/185.17, 185.29, 365/185.11, 185.12, 185.16, 185.28, 189.01

(56) References Cited

U.S. PATENT DOCUMENTS

| | | | | |
|---|---|---|---|---|
| 5,086,413 A | * | 2/1992 | Tsuboi et al. | 365/230.01 |
| 5,748,538 A | * | 5/1998 | Lee et al. | 365/185.06 |
| 5,963,475 A | | 10/1999 | Choi et al. | |
| 5,969,990 A | | 10/1999 | Arase | |
| 6,069,831 A | * | 5/2000 | Jang et al. | 365/210 |
| 6,282,145 B1 | * | 8/2001 | Tran et al. | 365/230.06 |

OTHER PUBLICATIONS

M, Momodomi, et al. "New Device Technologies for 5v–Only 4mb EEPROM with NAND Structure Cell" pp. 412–415.

R.Kirisawa, et al. "A NAND Structure Cell with A New Programming Technology for Highly Reliable 5v–Only Flash EEPROM" 1990 Symposium on VLSI Technology, pp. 129–130.

Yoshihisa Iwata, et al. "A High–Density NAND EEPROM with Block–Page Programming for Microcomputer Applications" 1990 IEEE, pp. 417–423.

* cited by examiner

*Primary Examiner*—Thong Le
(74) *Attorney, Agent, or Firm*—Marger Johnson & McCollom, P.C.

(57) ABSTRACT

Disclosed is a nonvolatile semiconductor memory device having a memory cell array by which random access can be performed. The memory cell array structure of the nonvolatile semiconductor memory device having a main memory cell array formed of a plurality of NAND cell strings includes a sub memory cell array having a plurality of NAND cell strings that is provided therein with memory cell transistors. The number of the memory cell transistors in the sub memory cell array is less than that of the memory cell transistors in the NAND cell strings of the main memory cell arrays. The sub memory cell array is operationally connected to main bit lines of the main memory cell array during program and erase operations and is electrically disconnected with the main bit lines during read operation, thereby having a separate read path that is independent from the read path of the main memory cell array.

33 Claims, 13 Drawing Sheets

SEMICONDUCTOR MEMORY DEVICE HAVING MEMORY CELL ARRAYS CAPABLE OF ACCOMPLISHING RANDOM ACCESS

This application claims priority from Korean Priority Document No. 2001-32466, filed on Jun. 11, 2001, which is hereby incorporated by reference in its entirety.

BACKGROUND OF THE INVENTION

1. Field of the Invention

This disclosure relates to a nonvolatile semiconductor memory device having an electric erasable/programmable function, and more particularly, to a NAND Structure nonvolatile semiconductor memory device having electrically erasable and programmable memory cells.

2. Description of the Related Art

Generally, semiconductor memory devices are classified into two groups, that is, volatile semiconductor memory devices and a nonvolatile semiconductor memory devices. Volatile semiconductor memory devices can be further classified into a dynamic random access memory and a static random access memory. Volatile semiconductor memory devices have rapid speed in writing and reading, but have a disadvantage that contents stored in memory cells are erased when electric power supply is cut off.

Nonvolatile semiconductor memory devices are classified into mask read only memorys (MROM), programmable read only memorys (PROM), erasable and programmable read only memorys (EPROM), and electrically erasable programmable read only memorys (EEPROM). Since a nonvolatile semiconductor memory device permanently stores any contents in the memory cells even though an external electric power supply is cut off, the device is mainly used in storing contents that are required to remain therein irrespective of whether electric power is supplied or not.

However, a user cannot perform reading and writing (or programming) without restraint through an electronic system provided with the MROM, PROM, and EPROM. That is, it is not easy for a user to erase or reprogram contents programmed on-board. In contrast, since the EEPROM can perform electrically erasing and writing operations in its system itself, it has been applied and will continuously be applied as a system program storing device or a sub-memory device that need to have their contents continuously renewed.

In other words, various electronic systems being controlled by a recent computer or microprocessor have required an improved EEPROM having accurately erasable and programmable functions. Furthermore, since a battery powered computer system having a notebook size or portable computer size employs a hard disk device having a rotational magnetic disk occupying a relatively large area as a supplementary memory device, designers designing such systems have been very interested in developing a high integrated and high performance EEPROM, having a relatively small size.

It is very important to reduce the area occupied by memory cells in order to accomplish a high integrated EEPROM. In order to solve such a problem, an EEPROM having memory cells with a NAND structure, by which the number of select transistors per cell and the number of contact holes contacted with bit lines can be reduced, has been developed. As an example, such a NAND structure cell has been disclosed in pages 412 to 415 of IEDM under the title of "NEW DEVICE TECHNOLOGIES FOR 5V-ONLY 4 Mb EEPROM WITH NAND STRUCTURE CELL", which is hereby incorporated herein.

Such a NAND structure cell will be explained below to provide better understanding for the present invention to be explained later.

The above-mentioned NAND structure cell consists of a first select transistor, a second select transistor, a source of which is coupled to a common source line, and eight memory transistors channels of which are in series connected between the source of the first select transistor and the drain of the second select transistor. The NAND structure cells are formed on a P type semiconductor substrate, and each of the memory transistors has a floating gate formed by forming a gate oxide film on a channel region between the source region and drain region and a control gate formed on the floating gate through an interlayer insulating layer. In order to program a memory transistor selected within the NAND cell unit, all of the memory transistors within the cell unit are erased, then programming operations are performed. The erasing operations of all of the memory transistors (generally called a flash erasing operation) are performed at the same time by applying 0 Volts to bit lines and, approximately 17 Volts to a gate of the first select transistor and control gates of all of the memory transistors. That is, all the memory transistors are converted to enhancement mode transistors, which are assumed to be transistors programmed by a binary digit "1".

In order to program the selected memory transistors with a binary digit "1", approximately 22 Volts is applied to bit lines, a gate of the first select transistor, and a control gate of each of the memory transistors between the first select transistor and the selected memory transistors. And, 0 volts is applied to a control gate of the selected memory transistor, a gate of the second select transistor and a control gate of each of the memory transistors between source lines and the selected memory transistors. Therefore, the selected memory transistor is programmed from a drain thereof to a floating gate by Fowler-Nordheim F-N tunneling of holes.

However, such a programming method has a problem in that a gate oxide film is stressed by a high voltage applied to a drain of the selected memory transistor and the stressed gate oxide layer accordingly causes current leakage there through. As a result, the ability of data retention in the memory cell is decreased as erasing and programming are continuously repeated, resulting in a decrease in the reliability of an EEPROM. In order to solve such a problem, an erasing and programming technique employing an improved device, in which NAND cell units are formed on a P type well region formed on an N type semiconductor substrate, has been disclosed on pages 129 to 130 of "symposium on VLSI Technology" published in 1990 under the title of "A NAND STRUCTURED CELL WITH A NEW PROGRAMMING TECHNOLOGY FOR HIGHLY RELIABLE 5V-ONLY FLASH EEPROM". In the disclosures, the erasing operations of the memory cells, all the memory transistors within the NAND cell unit, are performed by applying 0 Volts to all the control gates and 20 Volts to the P type well region and the N type substrate. Electrons are evenly discharged from floating gates of all of the memory transistors to the P type wells. As a result, the threshold voltage of all of the memory transistors is converted to a negative voltage of −4V, and the transistors become in a state of depletion mode from which a binary logic "0" is assumed as being stored therein. In order to program the selected memory transistors within the NAND cell unit, a high voltage of 20 V is applied to a gate of the first select transistor and a control gate of the selected memory transistor, 0 V to a gate of the second select transistor, and a middle voltage of 7 V to a control gate of each of the non-selected memory transistors, respectively. If the selected memory transistor is programmed by a binary logic "1", 0 V is applied to bit lines coupled to the NAND cell unit, thereby the floating gate of the selected memory transistor is implanted with electrons and the selected memory transistor is converted to a state of enhancement mode. In contrast, if the selected memory transistor is programmed by a binary logic "0", a middle voltage of 7V to prevent programming is applied to the corresponding bit lines, thereby the programming operation of the selected memory transistor is prevented. Since such a programming operation allows electrons to be evenly implanted into the floating gate through the gate oxide layer from the P type well, partial stress is not created in the thin gate oxide layer, preventing current leakage in the gate oxide layer.

When system designers wish to perform an erasing operation to reprogram a part or block of programmed or written memory cells, a problem occurs. In this case, a generally used method is to simultaneously erase (eg. flash erasing) all of the memory transistors within memory cell array and thereafter reprogram all the contents already programmed and new contents to be programmed.

Therefore, since even the part or block of memory cells that can still be used with the new program are simultaneously erased, it takes several, iterations, as well as being inconvenient to reprogram the new program and the existing program. Such an inconvenience will be severely created as capacity in a memory needs to become more and more increased. Erasing all of the memory transistors only within the selected memory block removes the majority of those problems. However, in the case of the EEPROM employing the foregoing improved erasing and programming technique, a high voltage more than 18 V or equal to the erasing voltage needs to be applied to a control gate of each of the memory transistors in the non-selected block to prevent the memory transistors from being erased.

As described above, the EEPROM design technique has continuously been improved for a relatively long time, and the NAND type Flash EEPROM accordingly created to have a flash erasing function can be advantageously applied as a large scaled sub-memory device because of the high degree of integration as compared with a common EEPROM. According to the type of the unit memory cell array of the flash EEPROM, the flash EEPROM is divided into a NAND type, NOR type, and NAND type. The NAND type has a higher integration degree than the Nor or AND type, as described above.

The NAND flash EEPROM memory cell is fabricated in such a manner that n-type regions to function as source and drain regions are formed on a P type substrate in a predetermined space from each other, thereafter, floating gate and control gate that are separated by an insulating layer are in order formed on an upper portion of a channel region placed between the source and drain regions. The conductive floating gate (FG) that is surrounded by the insulating layer is accumulated therein with charges that function as program data in response to a program voltage applied to the control gate (CG).

The erasing, writing and reading operations of the NAND type flash EEPROM are now explained below.

The erase and write operations are performed by utilizing F-N tunneling current. For instance, during an erasing operation, a high voltage is applied to a substrate and a low voltage is applied to a control gate (CG). In this case, a voltage is determined in response to the ratio of the capacitance between the CG and FG and the capacitance between the FG and the substrate, and the voltage is applied to the FG.

When the difference in potential between the floating gate voltage (Vfg) applied to the FG and the substrate voltage (Vsub) applied to the substrate is larger than the difference in potential that causes F-N tunneling, electrons in the FG begin to flow toward the substrate. As a result, the threshold voltage (Vt) of the memory cell transistor consisting of CG, FG, source and drain changes. Although 0V is applied to the CG and the source in a state that the Vt is sufficiently lowered, if current flows when a properly high voltage is applied to the drain, such a state is called "ERASED" and indicated logically as "1". On the other hand to write data to a cell, 0 V is applied to a source and a drain and a very high voltage is applied to the CG. At this time, the channel region is formed therein with an inversion layer and the source and drain maintain an electric potential of 0V.

When the difference in electric potential that is applied between Vfg and channel voltage V channel (0V) that is determined by the capacitance ratio between the CG and FG and between the FG and channel region becomes so large as to create a F-N tunneling, electrons flow from the channel region to the FG. In this case, the Vt increases, and if electric current does not flow when a predetermined level of voltage is applied to the CG, 0V is applied to the source, and a proper level of voltage is applied to the drain, it is called "PROGRAMMED" and indicated as logic "0".

Even in the NAND flash memory as described above, the basic unit of a memory cell array, like the structure as previously described, includes a first select transistor, a second select transistor, and a cell string formed of a plurality of memory cell transistors in which drain-source channels are in series connected to each other and its FGs are formed between the first and second transistors. Wherein, it should be noted that the cell string may be also called a NAND cell unit in this field. The common NAND flash memory includes a memory cell array having a plurality of the cell strings, bit lines for inputting data to the cell strings and receiving data from the cell string, word lines crossed with the bit lines for controlling gates of the memory cell transistors and the select transistors in the cell string, an X decoder for selecting the word lines, page buffers connected to the bit lines to sense and store input/output data of the memory cell transistors, and a Y decoder circuit for controlling data input/output to the page buffers.

The page unit in the memory cell array structure indicates the memory cell transistors that are commonly connected to one word line at its control gates. The plurality of pages including a plurality of memory cell transistors is called cell block. One cell block unit generally includes one or a plurality of cell strings per bit line. One NAND flash memory as described above has a page program mode for a high-speed programming operation. The page program operation includes a data loading operation and a programming operation. The data loading operation is an operation for latching and storing data of byte size from input/output terminals in data registers. The data register is provided to correspond to each of the bit lines. The programming operation is an operation by which data stored in the data registers are simultaneously registered in memory transistors on a word line selected through bit lines. The page programming technique in an EEPROM having NAND cell units is disclosed in pages 417 to 423 of IEEE JOURNAL OF SOLID-STATE CIRCUITS, VOL.25, NO.2 issued April 1990.

As described above, the NAND flash memory generally performs a read operation and a program operation by a page unit and an erase operation by a block unit. Practically, the phenomenon that electrons flow between the FG and the channel of the memory cell transistor occurs in erase and program operations only. In a read operation, an operation of reading data stored in memory cell transistors without damaging the data occurs after the above-operations are ended.

In the read operation, a non-selected CG of NAND flash memory is supplied with a higher voltage than that supplied to a CG of selected memory. As a result, an electric current flows or does not flow in the corresponding bit lines in response to a programmed state of the selected memory cell transistor. In a predetermined voltage condition, if the threshold voltage of the programmed memory cell is higher than a reference voltage, the memory cell is identified as an off-cell and thereby the corresponding bit line is charged to a high level of voltage. In contrast, if the threshold voltage of the programmed memory cell is lower than a reference voltage, the memory cell is read as an on-cell, and thereby the corresponding bit line is discharged to a low level of voltage. Such a bit line state is finally read as "0" or "1" by a sense amplifier that is called a page buffer.

In this case, since there are many cell strings that are coupled to one bit line, the load amount in the bit line becomes large and the amount of current flowing through the on-cell during sensing the on-cell is small. Accordingly, as the voltage developing time grows relatively larger, the sensing time becomes longer. As a result, the reading time that it takes for the page buffer to read the stored date also increases resulting in a long read operation. In order to settle such an undesirable state, the NAND flash memory performs a page unit operation of page unit during a read operation. In the operation of a page unit, all data of the cells in one page are read at one time and the results are in order output, which is called a serial access. As a result, when the amount of data is large, data reading time per one bit is likewise reduced, thereby the relatively long sensing time can be compensated.

However, since the page unit operation randomly selects addresses to be read, its efficiency is remarkably reduced when accessing data or reading a small amount of data. That is, the access time that takes in reading data of one bit is nearly the same as that of reading data of one page.

Due to the characteristics of the NAND flash memory read operation, there is a problem in that the NAND flash memory is limited in its use in a memory application field that requires a random access of high-speed. For example, the NAND flash memory is limited in its use in the case that a small amount of data such as ROM table information or indexing information concerning data stored in a main memory cell array should be read with a higher speed than the read time of the flash memory cell array. Accordingly, advanced techniques are required to read data at a higher speed than in a random access of high-speed or an access to minor data.

SUMMARY OF THE INVENTION

Embodiments of the present invention provide a nonvolatile semiconductor memory by which data can be read in a higher speed than in a random access of high-speed or an access to minor data.

Embodiments of the present invention provide a nonvolatile semiconductor memory cell array structure having a reduced read operation time that is useable in fields requiring high-speed random access, in a NAND type clash memory array According to embodiments of the invention, a high-speed random access is selectively performed in a same memory. The structure can be used in the memory application field that requires a high speed in randomly reading minor data and ROM tables for a high-speed read.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS

Figure 1:
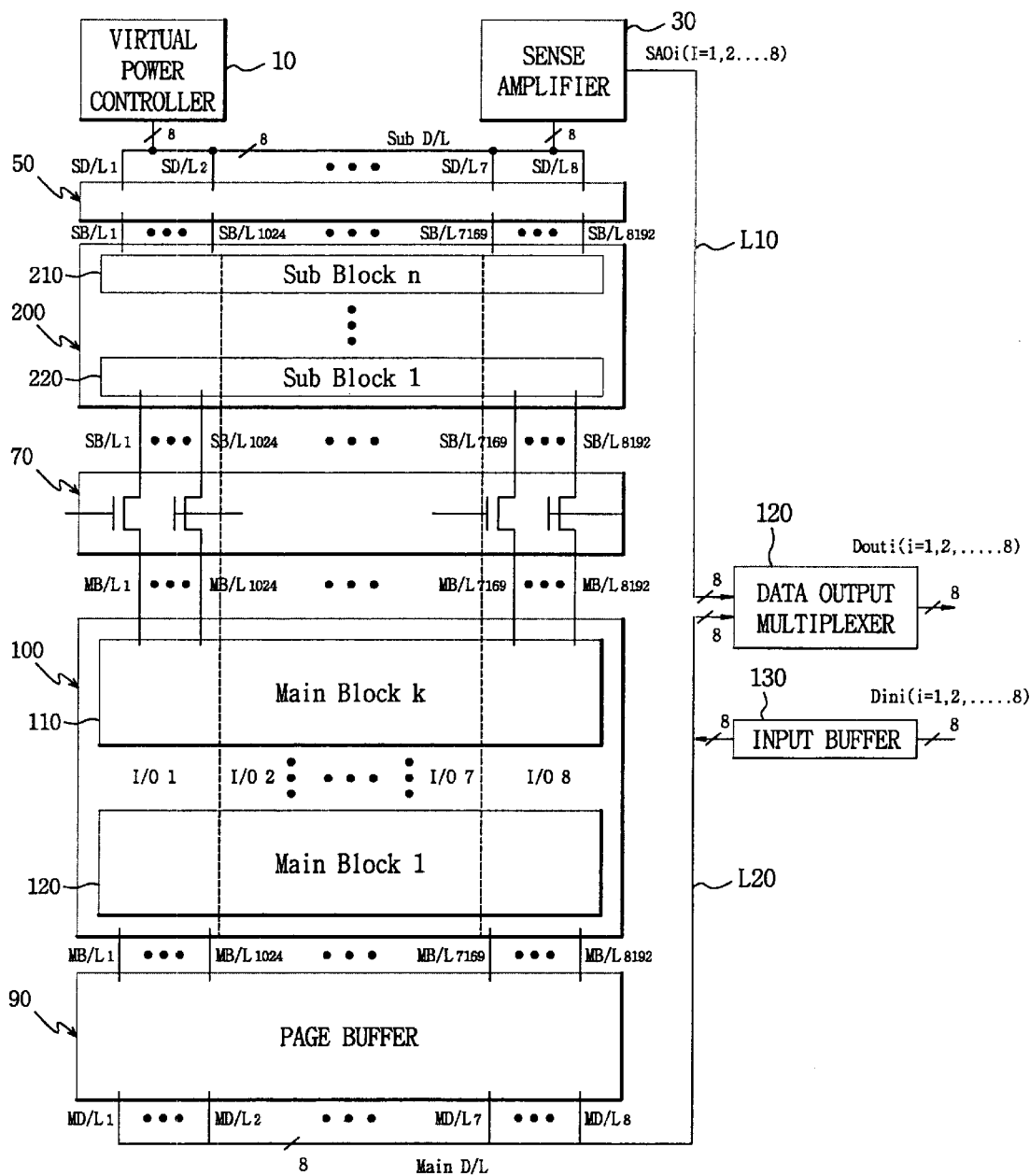
FIG. 1 is a block diagram of a memory cell array of a semiconductor memory device according to an embodiment of the present invention.

Hereinafter, embodiments the present invention will be described in detail with reference to the accompanying drawings. It should be noted that like reference numerals are used through the accompanying drawings for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures to clarify key points of the present invention.

FIG. 1 is a block diagram of a memory cell array of a semiconductor memory device according to an embodiment of the present invention. Referring to FIG. 1, the memory cell array includes a main memory cell array 100 for serial access and a sub memory cell array 200 for random access.

The sub memory cell array 200 has been designed to be used in only a random access operation that requires data read of higher speed than in the main memory cell array 100, in an attempt to achieve the above described advantages. The sub memory cell array 200 may store indexing information concerning data stored in the main memory cell array 100. In addition, the sub memory cell array 200 may store, as data, ROM table information that requires random access of high speed or information that requires a high-speed data read operation. Between the main memory cell array 100 and the sub memory cell array 200 are a sub bit line selector 70 formed of shut-off transistors. In the example memory cell array of FIG. 1, The sub bit line selector 70 selectively connects the sub bit lines SB/L1–SB/L8192 of the sub memory cell array 200 to the main bit lines MB/L1–MB/L8192 of the main memory cell array 100. When the memory cell transistors in the sub memory array 200 are electrically programmed or erased, the gates of the shut-off transistors are supplied with a higher voltage than a voltage supplied to the sub bit lines. As a result, the sub bit lines are connected to the corresponding main bit lines, thereby data in the sub memory cell array 200 are programmed or erased in the same manner as in the main memory cell array 100.

In the case that data stored in the memory cell transistors in the sub memory cell array 200 are read, the shutoff signal input to the sub bit line selector 70 becomes 0V. Accordingly, the sub bit lines SB/L1–SB/L8192 of the sub memory cell array 200 are electrically disconnected with the main bit lines MB/L1–MB/L8192 of the main memory cell array 100. The read route of the sub memory cell array 200 is separated from the read route of the main memory cell array 100. That is, in the case of the main memory cell array 100, data are sensed using a page buffer 90 connected to the main bit lines MB/L1–MB/L8192 as a sense amplifier. In contrast, in the case of the sub memory cell array 200, the page buffer 90 is used in program operation and erase operation, but not used in a read operation. That is, a separate sense amplifier is used.

The sub memory cell array 200 is formed of a plurality of I/O sub arrays, each of which is connected to the corresponding sense amplifier 30. In the drawing, a sub array column selector 50 serves to connect each of the columns of the sub memory cell array 200 to the sense amplifier 30. The sub array column selector 50 is connected between the main bit lines SB/L1–SB/L8192 and the sub data lines SD/L1–SD/L8. A virtual power controller 10 controls a power supply voltage so that the sub bit lines SB/L1–SB/L8192 may be supplied with the power supply voltage through the sub data lines SD/L1–SD/L8 during program and erase operations, and the sense amplifier 30 connected to the sub data lines SD/L1–SD/L8 may be supplied with data during a read operation.

A data output multiplexer 120 serves to selectively output data that appear in the sub data lines SD/L1–SD/8 and main data lines MD/L1–MD/L8. A input buffer 130 performs input buffering so that data input from an external may be written in a selected cell out of the main memory cell array 100 and the sub memory cell array 200 during a program operation.

Figure 2:
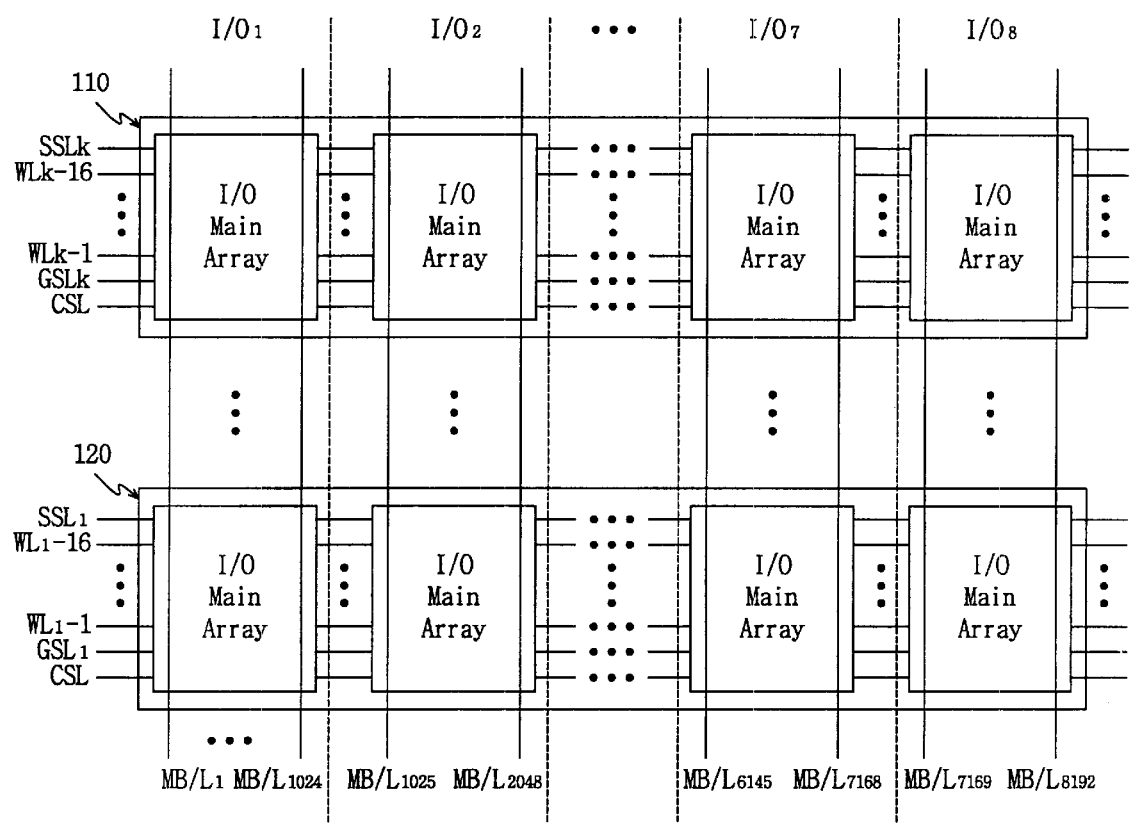
FIG. 2 is a detailed block diagram showing the structure of main array blocks for serial access shown in FIG. 1.
Figure 3:
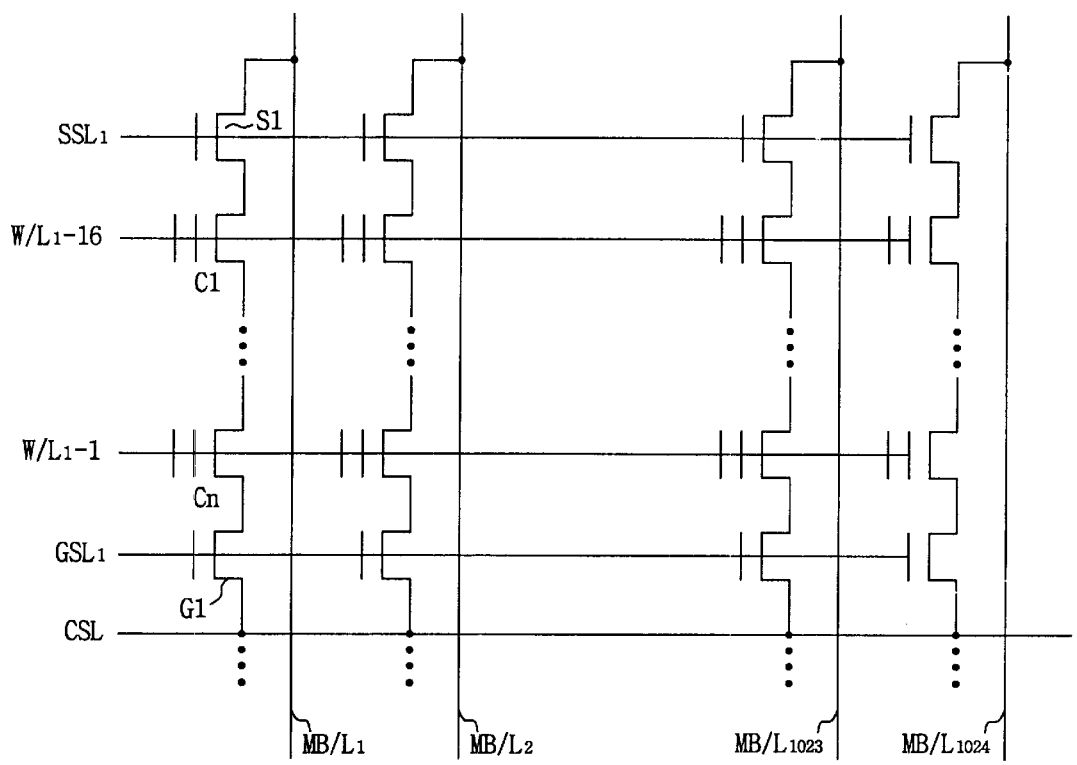
FIG. 3 is a detailed circuit diagram showing one of the I/O main arrays shown in FIG. 2.

FIG. 2 is a detailed block diagram showing the general structure of main array blocks for serial access shown in FIG. 1, and FIG. 3 is a detailed circuit diagram showing one of the I/O main arrays shown in FIG. 2. Referring to FIG. 2, each of the plurality of main array blocks 110, 120 in the main memory cell array 100 is formed of 8 I/O main arrays so that eight sets of data may be input and output at one time. Each of the I/O main arrays, as shown in FIG. 3, includes a first select transistor S1 having a drain connected to the corresponding bit line out of the bit lines MB/L1–MB/L1024 and a source connected to a drain of memory cell transistor having a FG; a second select transistor G1 having a drain connected to a source of the memory cell transistor having a FG and a source connected to a common source line (CSL); and a cell string formed of a plurality of memory cell transistors C1–Cn having drain-source channels series connected between the first and second select transistors. The memory cell transistors C1–Cn each have floating gates (FG).

The page unit means the memory cell transistors, which are located at a horizontal direction in FIG. 3, that are connected to one word line, W/L1-1 for instance, at its gates.

The plurality of pages that include a plurality of memory cell transistors is called a cell block. One cell block unit includes one cell string or plurality of cell strings per a bit line. In the structure shown in the drawings, read and program operations are performed on a page unit, and an erase operation is performed on a block unit like in the conventional manner.

Figure 4:
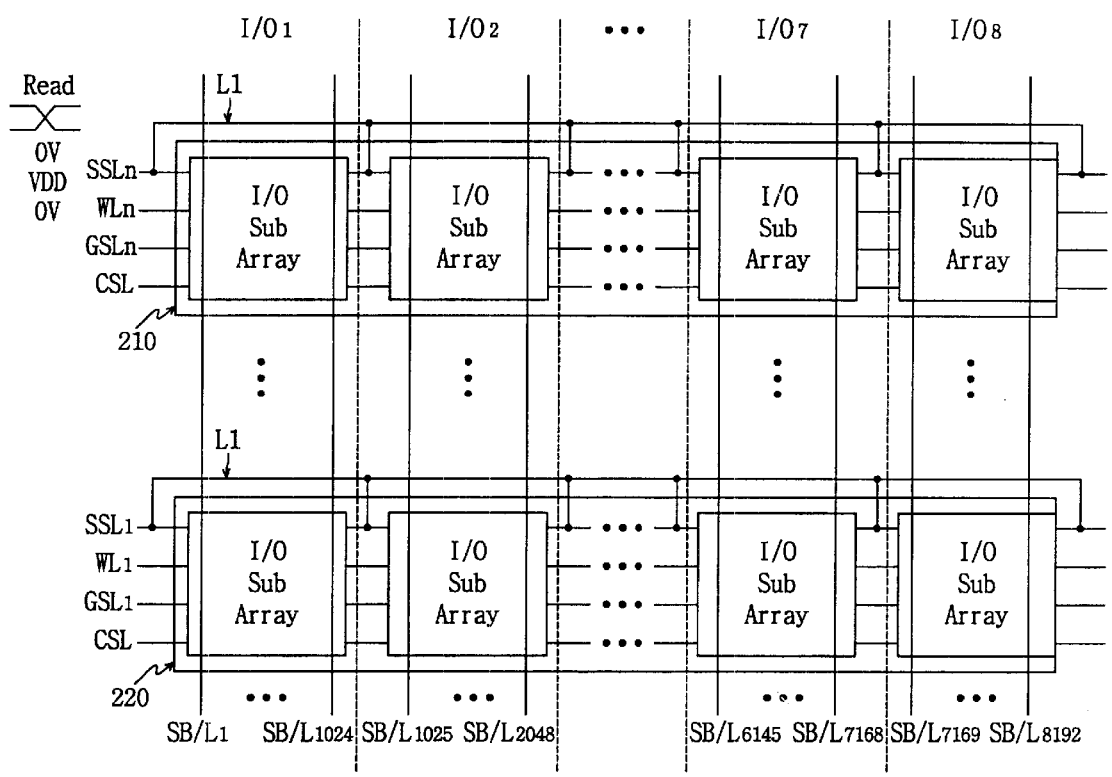
FIG. 4 is a detailed block diagram showing one structure of the sub array blocks for random access shown in FIG. 1.
Figure 5:
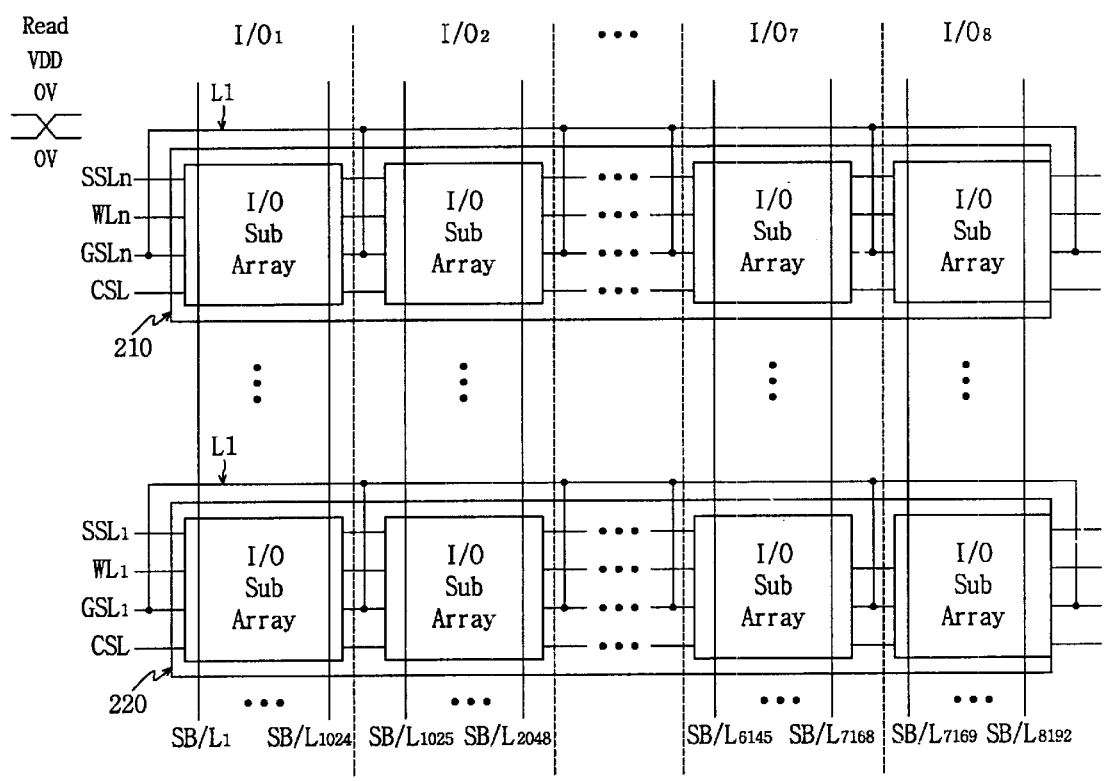
FIG. 5 is a detailed block diagram showing another structure of the sub array blocks for random access shown in FIG. 1.
Figure 6:
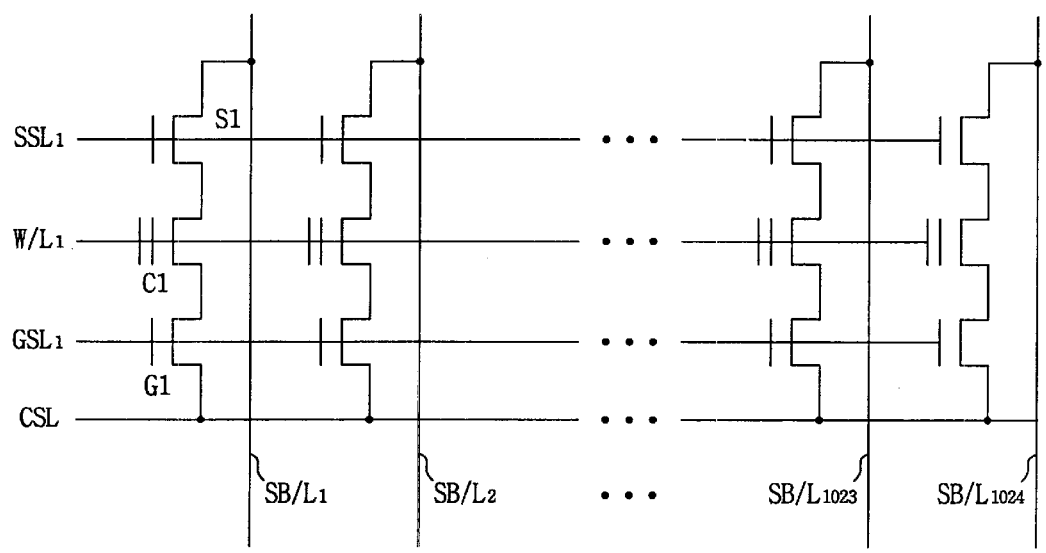
FIG. 6 is a detailed circuit diagram showing one of the I/O sub arrays shown in FIGS. 4 or 5.

FIG. 4 is a detailed block diagram showing one structure of the sub array blocks for random access, as shown in FIG. 1, and FIG. 5 is a detailed block diagram showing another structure of the sub array blocks for random access shown in FIG. 1. FIG. 6 is a detailed circuit diagram showing one of the I/O sub arrays shown in FIGS. 4 or 5. Referring to FIGS. 4 and 5, like the main array blocks, each of the plurality of sub array blocks 210, 220 in the sub memory cell array 200 is formed of 8 I/O sub arrays so that eight sets of data may be input and output at one time. Each of the I/O sub arrays, as shown in FIG. 6, includes a first select transistor S1 having a drain connected to the corresponding bit line out of the sub bit lines SB/L1–SB/L1024, and a source connected to a drain of memory cell transistor having a FG and its gate is connected to a string select line SSL1; a second select transistor G1 having a drain connected to a source of the memory cell transistor having a FG, and a source connected to a common source line (CSL) and its gate connected to a ground select line GSL1; and a cell string formed of a memory cell transistor C1 having a FG connected between the first and second select transistors.

The drawings show that the string has only one memory cell transistor and one word line is connected to control gates of the memory cell transistors in the plurality of strings. However, if necessary, the string of the sub memory cell array may have a plurality of memory cell transistors, even though the number of which is less than that of the memory cell transistors in the cell string of the main memory cell array.

In order to make a random access operation faster, the string select line SSL or the ground select line GSL may be made of a good conductive metal line, for instance, silicide such as tungsten. Such a metal line serves to reduce resistance during operation. In addition, due to the formation of the sub memory cell array formed of sub array blocks having a plurality of I/O sub arrays as shown in FIG. 6, loading of the sub bit line is reduced during a read operation and the sensing time is accordingly much reduced. As a result, a high-speed random access can be achieved.

As an example of forming the select lines with a good conductive metal, in FIG. 4, the string select line SSL1–SSLn is formed of metal line L1. In this case, it is profitable when a select signal is input to the string select line SSL, thereby data in the memory cell transistor C1 are accessed. In case that the select signal is input to the string select line SSL and data is accordingly read, when the I/O sub array is at a non-operational state, the word line voltage is less than the threshold voltage of cell that is at an off state and the voltage input to the string select line GSL is at a level by which the first select transistor S1 can be turned-on.

In FIG. 5, the ground select line GSL1–GSLn is formed with the metal line L1, which is suitable for the case that data is accessed by inputting the select signal to the ground select line GSL. In the case that data is accessed by inputting the select signal to the ground select line GSL, while the I/O sub array is at a non-operational state, the word line voltage is less than the threshold voltage of an off state cell and the voltage input to the ground select line GSL is at a level as much as the second select transistor S1 can be turned-on.

According to the embodiment of the present invention as described above, the sub memory cell array 200 is formed of the sub array blocks 210, 220 having the plurality of I/O sub arrays shown in FIG. 6, thereby the number of the memory cell transistors in one cell string becomes fewer than that of the memory cell transistors in the cell string of the main memory cell array 100, and as a result, loading of the bit lines becomes decreased. In addition, since the amount of electric current flowing through on-cells during sensing the on-cells is relatively more than in the case of the main memory cell array, voltage developing time can be reduced. In other words, the sensing time of a read operation can be reduced and accordingly a high-speed random access is achieved.

Figure 7:
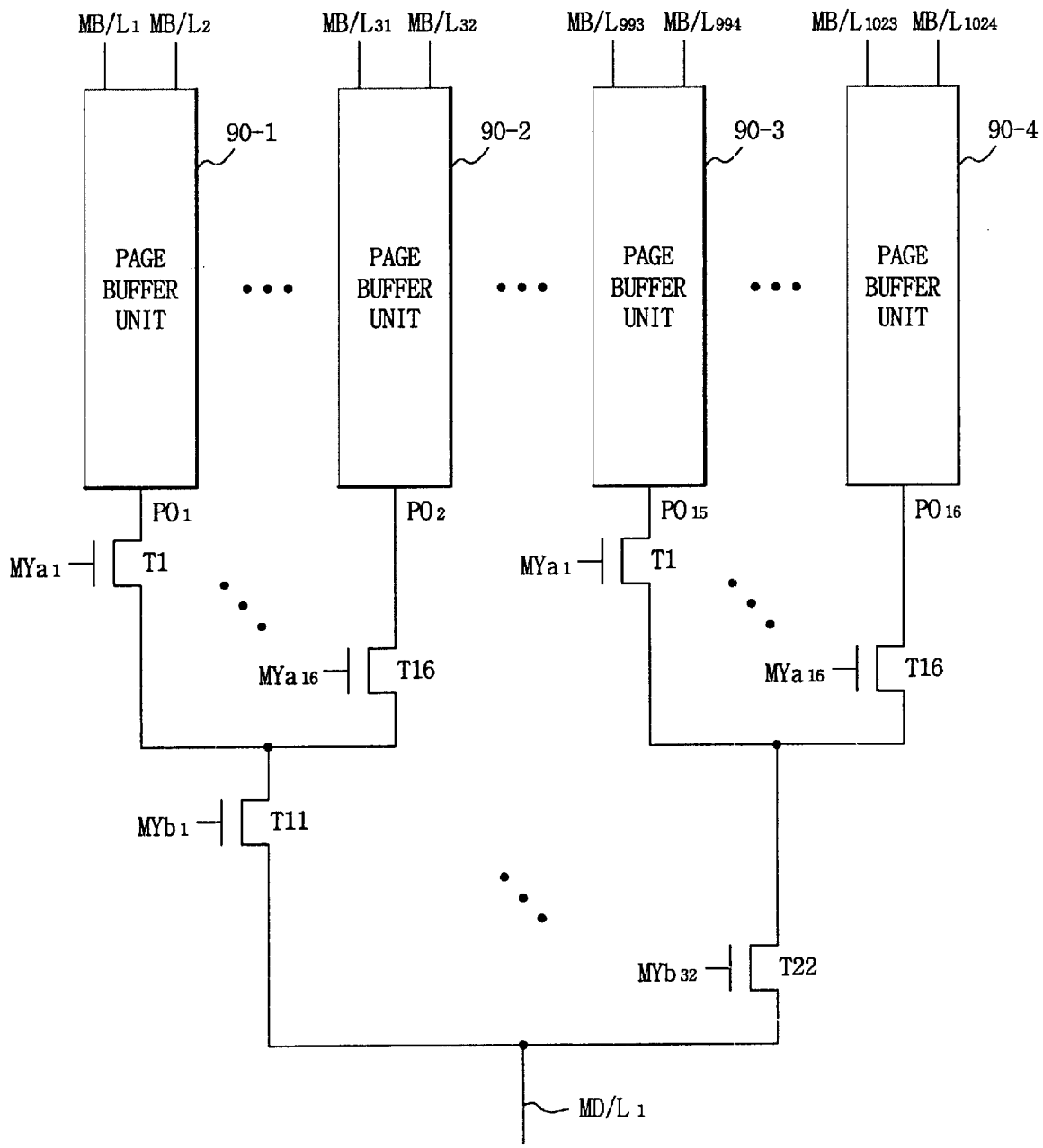
FIG. 7 is a circuit diagram illustrating the structure of the page buffer shown in FIG. 1.
Figure 8:
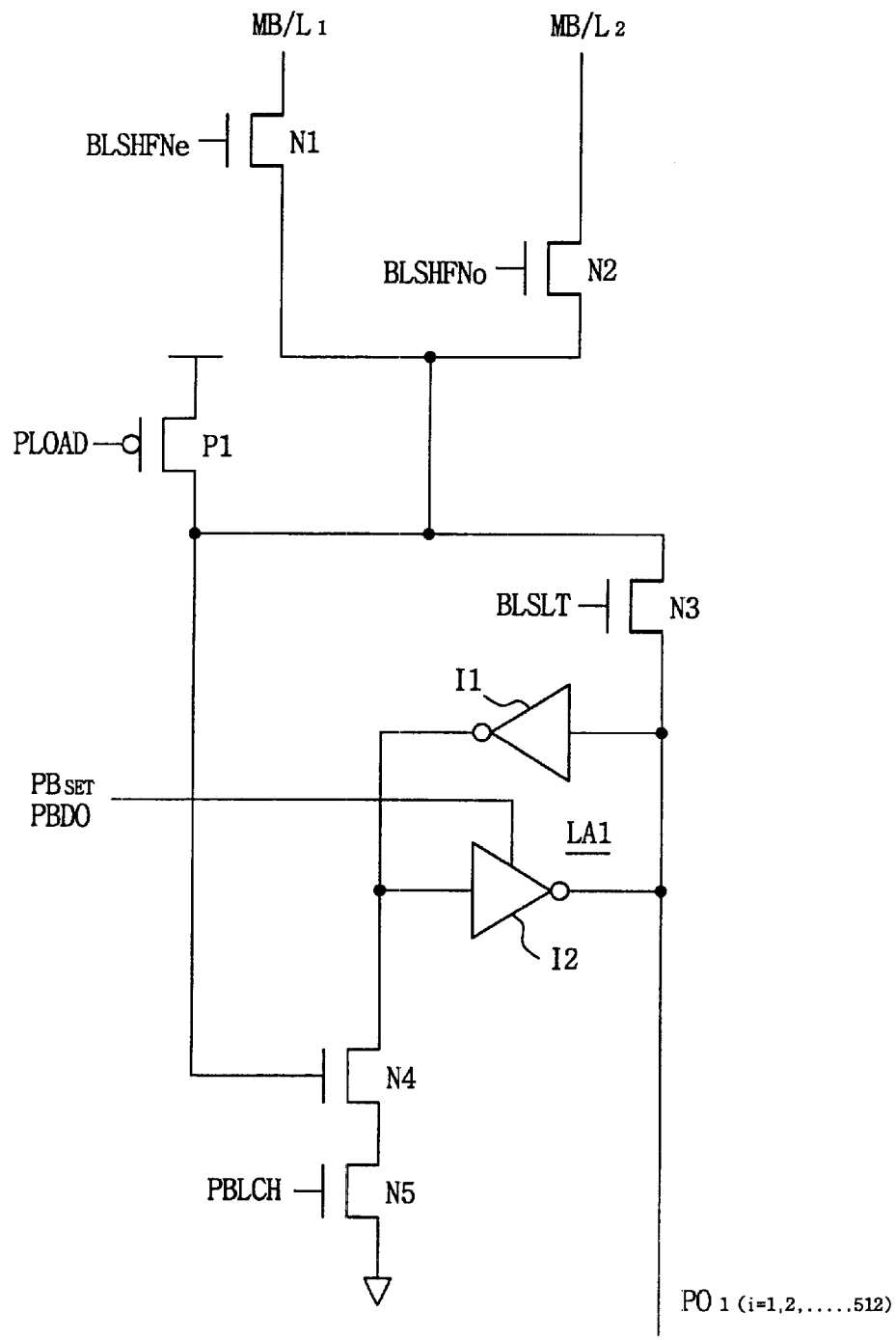
FIG. 8 is a detailed circuit diagram showing one of the page buffer units shown in FIG. 7.

FIG. 7 is a circuit diagram illustrating the structure of the page buffer 90 shown in FIG. 1, and FIG. 8 is a detailed circuit diagram showing one of the page buffer units shown in FIG. 7.

Referring to FIG. 7, it will be understood that one main data line MD/L1 is connected to the page buffer units. The page buffer itself includes a plurality of page buffer units 90-1, 90-4 each of which is connected to the corresponding two of the main bit lines MB/L1, MB/L2, MB/L1023, MB/L1024 to perform a data latch operation, and the select transistors T1–T22 controlled so that data output from the page buffer units 90-1, 90-4 are supplied to the main data line MD/L1. The gates of the select transistors T1–T22 are connected to the outputs of the Y decoder and data that is output from the page buffer units 90-1, 90-4 is selectively transmitted to the main data line.

Referring to FIG. 8, each of the page buffer units 90-1, 90-4 includes a latch LA1 formed of inverters I1, I2 and transistors N1–N5, P1 that are necessary to store data and output the stored data.

Figure 9:
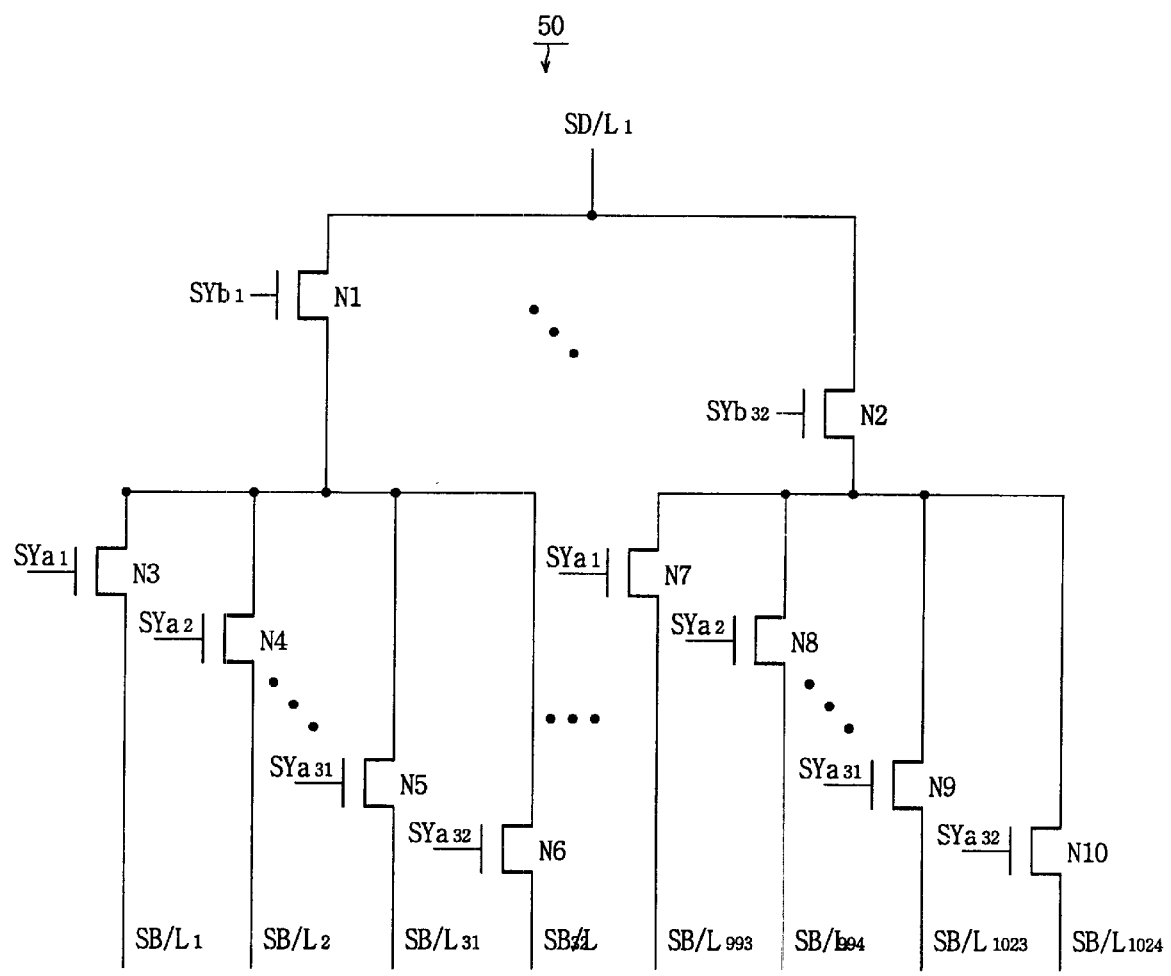
FIG. 9 is a detailed circuit diagram of the sub array column selector shown in FIG. 1.

FIG. 9 is a detailed circuit diagram of the sub array column selector 50 shown in FIG. 1. The sub array column selector 50 includes a plurality of transistors N1–N10 so that the sub bit lines SB/L1–SB/L8192 maybe selectively connected to the sub data line SUB D/L that is an input terminal of the sense amplifier 30.

The plurality of transistors N1–N10 are turned-on in response to the signals that are input through each of the gates to thereby transmit to the sub data lines SUB D/L data that appear on the sub bit lines SB/L1–SB/L8192 of the sub memory cell array 200.

Figure 10:
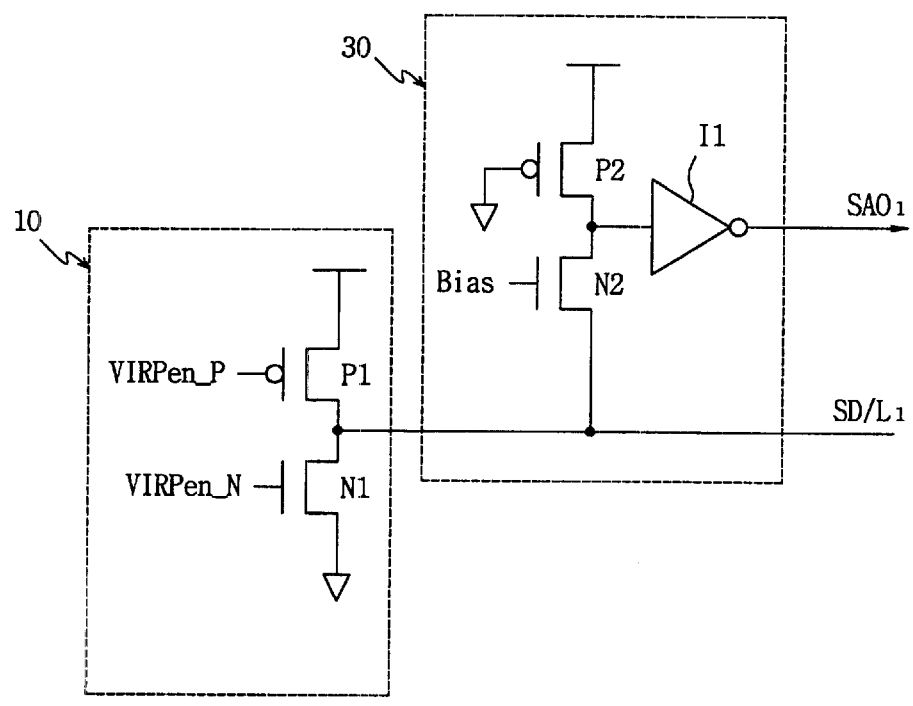
FIG. 10 is a detailed circuit diagram illustrating connection relationship between the virtual power controller and sense amplifier shown in FIG. 1.
Figure 10:
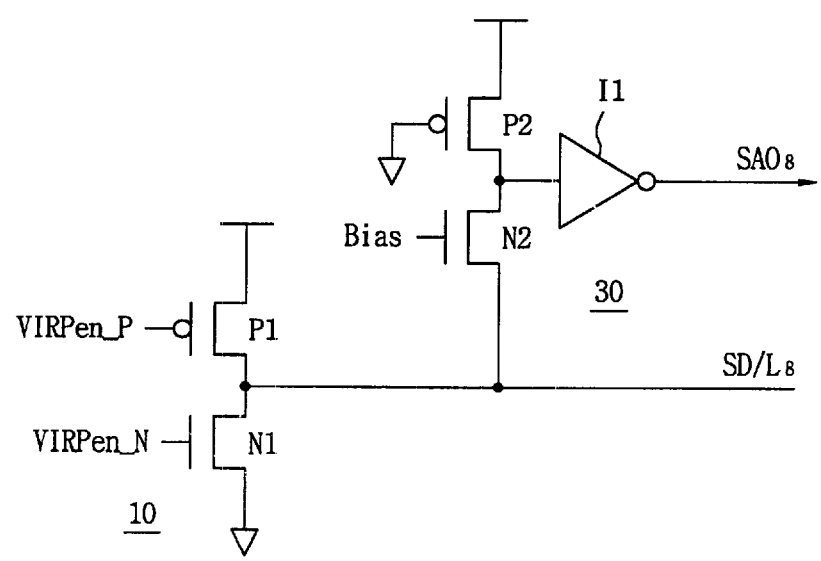

FIG. 10 is a detailed circuit view illustrating the relationship between the virtual power controller 10 and the sense amplifier 30 shown in FIG. 1. The virtual power controller 10 is formed of an inverter including transistors P1, N1. The virtual power controller 10 serves to supply a power supply voltage so that the sub bit lines SB/L1–SB/L8192 may be supplied with the power supply voltage through the sub data lines SD/L1–SD/L8 during erase and program operations, and supply a power supply voltage to the sub data lines SD/L1–SD/L8 so that the sense amplifier 30 connected to the sub data lines SD/L1–SD/L8 may be supplied with data during a read operation. The sense amplifier 30 includes P type and N type MOS transistors P2, N2 and an inverter I1 connected to output terminals of the N type and P type MOS transistors P2, N2. The drain of the NMOS transistor N2 is connected to corresponding line out of the sub data lines SD/L1–SD/L8, and its gate receives a bias voltage. The outputs of the inverter I1 are data outputted during random access and transmitted to the data output multiplexer 120 through the line L10 shown in FIG. 1.

Figure 11:
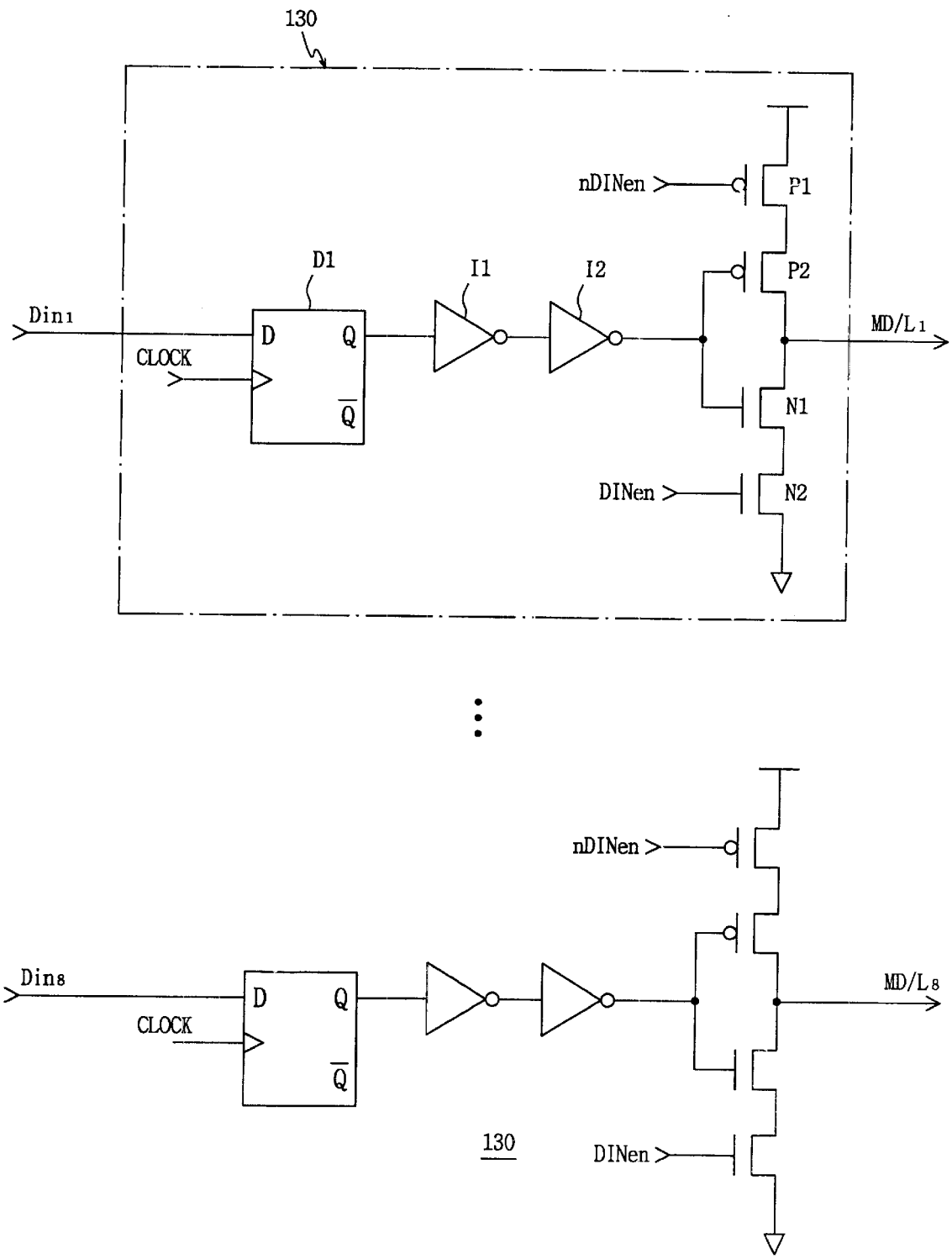
FIG. 11 is a detailed circuit diagram showing the data input buffer shown in FIG. 1.

FIG. 11 is a detailed circuit view of the data input buffer 130 shown in FIG. 1. There are a total of 8 data input buffers, one for every I/O. The data input buffer 120 includes a buffer having of a D flip flop D1 and inverters I1, I2 and a try state buffer comprised of N type and P type MOS transistors P1, P2, N1, N2, as shown in FIG. 11, so that program data inputted from I/O through the input terminal Din1 are supplied to the corresponding main data line in response to the clock signal CLOCK input. At a program operation, the control signal nDINen is as a low level input to a gate of the P type MOS transistor P1 and the control signal DINen is as a high level input to a gate of the NMOS transistor N1, thereby data output from the buffer is transmitted to the main data line MD/L1.

Figure 12:
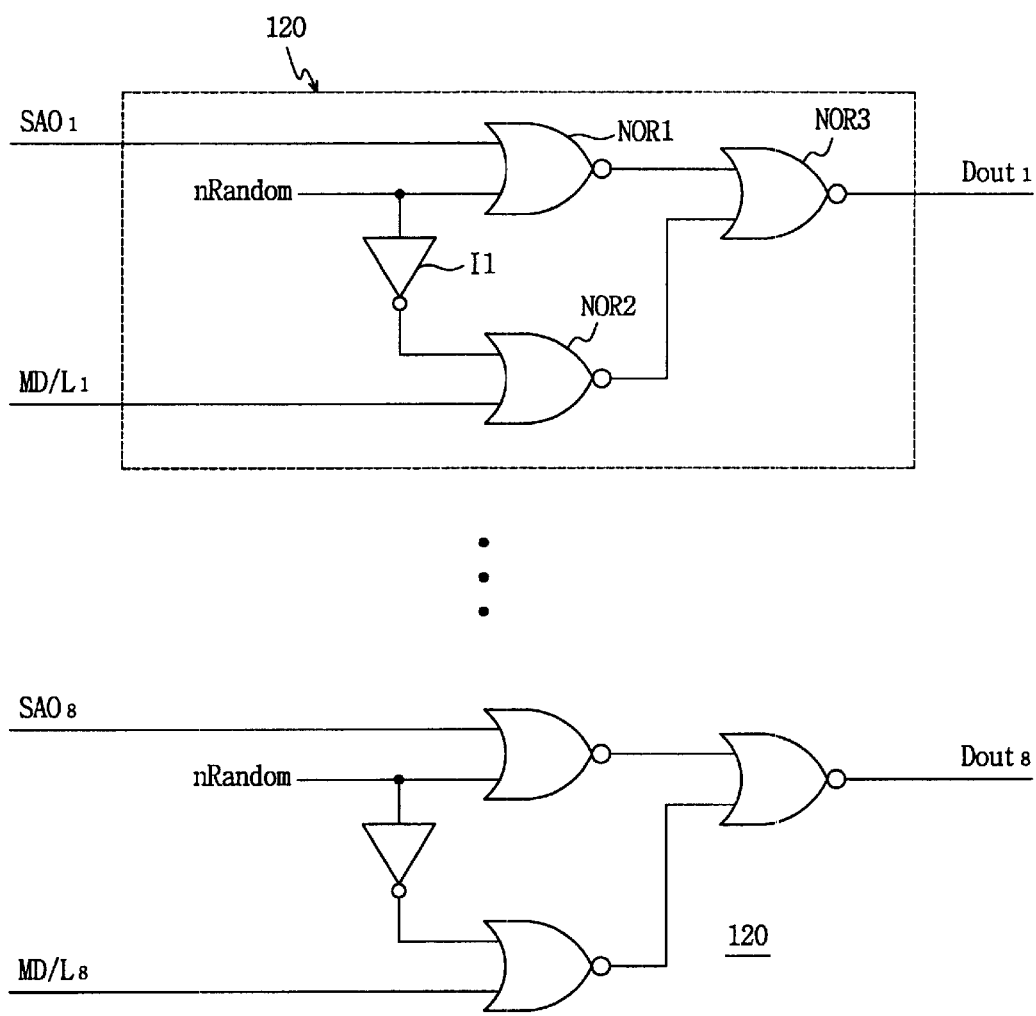
FIG. 12 is a detailed circuit diagram of the data output multiplexer in FIG. 1.

FIG. 12 is a detailed circuit view of the data output multiplexer 120 shown in FIG. 1. Like the data input buffer 130, there are total 8 data output multiplexers, one every I/O. Each of the multiplexers 120 has an inverter I1 for inverting a multiplexing control signal nRandom, a first NOR gate NOR1 for receiving an output data SAO1 of the sense amplifier 30 and the multiplexing control signal nRandom to thereby generate a NOR response, a second NOR gate NOR2 for receiving an output of the inverter I1 and the output of the main data line MD/L1 to thereby generate a NOR response, and a third NOR gate NOR3 for receiving outputs of the first and second NOR gates to thereby generate a NOR response to output it to the data output line Dout1, so that data that appear on the sub data lines SD/L1–SD/L8 and the main data lines MD/L1–MD/L8 are selectively output. After all, the structure shown in FIG. 12 is a connection structure in which a line is selected out of the line L10 and L20 according to a logic level of the multiplexing control signal nRandom and the resultant data are supplied to the data output line Dout1.

Figure 13:
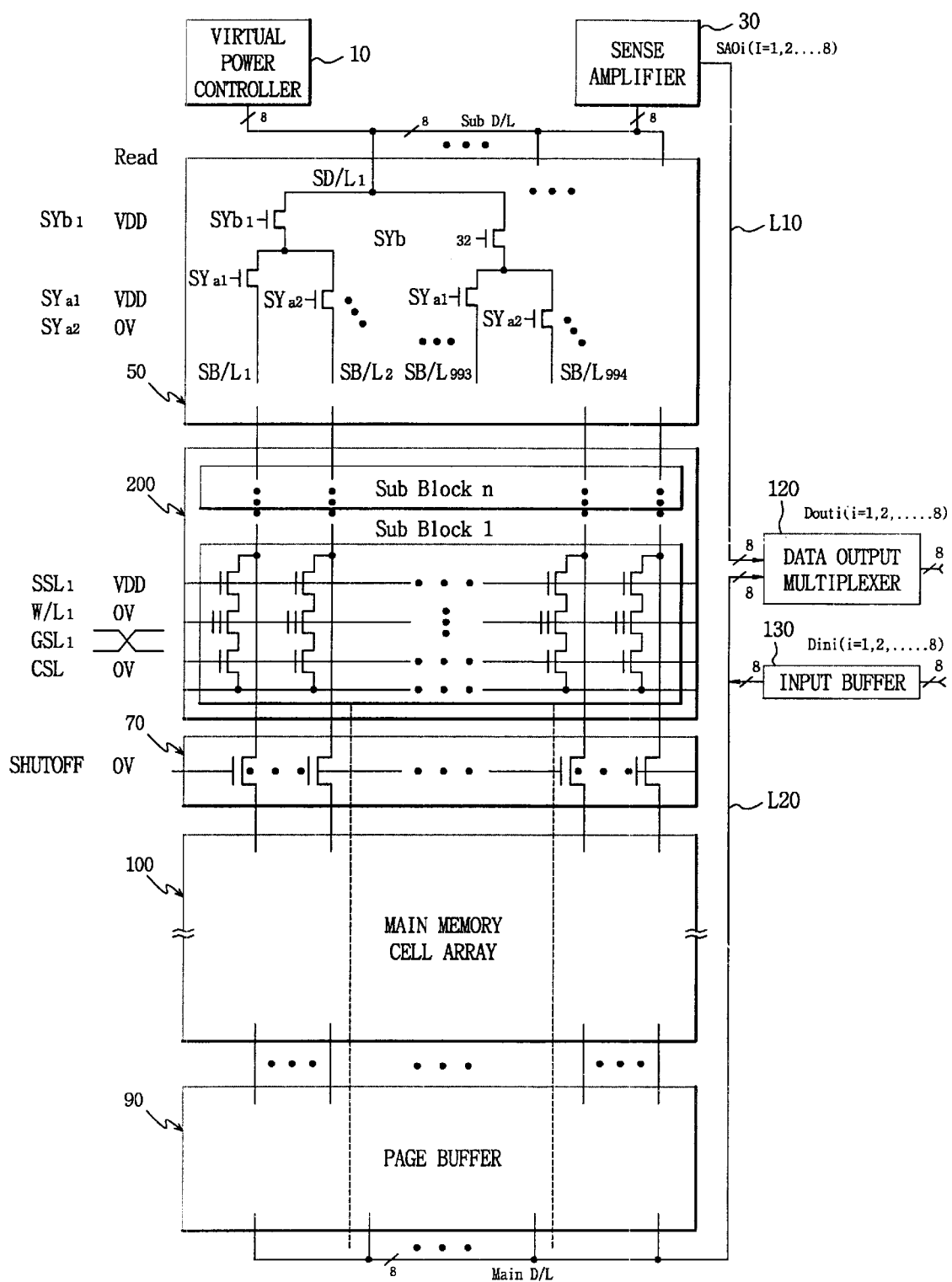
FIG. 13 is a detailed block diagram illustrating the read operation of the sub array block in FIG. 1.

FIG. 13 is a more detailed block diagram than FIG. 1 used to illustrate a read operation of the sub array block shown in FIG. 1. When data of I/O sub array memory cell transistor in the sub array blocks 210, 220 are programmed or the already stored data are erased, the shutoff signal SHUTOFF is input as a higher level of voltage than the voltage input to the sub bit lines. In addition, while the virtual power controller 10 is driven, the sub bit lines SB/L1–SB/L8192 are controlled to be supplied with a power supply voltage. Accordingly, the sub bit lines SB/L1–SB/L8192 and the main bit lines MB/L1–MB/L8192 are electrically connected to each other and data of the sub memory cell array 200 are also programmed or erased, in the same manner as the program or erase operation of the main memory cell array 100.

In other words, by providing the same voltage-input conditions as in the program or erase operation of the main memory cell array 100, data of memory cell transistor in the sub memory cell array 200 are programmed or data stored in the memory cell transistor are erased.

When it is necessary to read data of a ROM table for a high-speed read or minor data in a higher speed than a read time of the main memory cell array 100, such data pass through in the order of input buffer 130—main data line L20—page buffer 90—main bit line—sub bit line selector 70 sub bit line, thereafter stored in the memory cell transistor of the selected cell string in the sub memory cell array 200 during the above-mentioned program operation.

Next, the read operation for random access according to the present invention will be explained below.

When reading data stored in the memory cell transistors in the sub memory cell array 200, the level of the shutoff signal SHUTOFF that is input to the sub bit line selector 70 becomes 0V. In this case, the virtual power controller 10 is also driven. The sub bit lines SB/L1–SB/L8192 of the sub memory cell array 200 are electrically separated from the main bit lines MB/L1–MB/L8192 of the main memory cell array 100.

As shown in FIG. 13, the string select transistors in the sub array 200 are turned-on, and in a read operation that data stored in the memory cell transistors are developed to corresponding sub bit lines, when the SSL1, W/L1, GSL1 and CSL are in order input as a power supply voltage VDD, 0V, signal level and 0V, respectively, and when the select signals SYb1, SYa1, SYa2 of the sub array column selector 50 are input as power supply voltage VDD, power supply voltage VDD, 0V, respectively, the signals that are developed to the sub bit lines SB/L1–SB/L8192 within the sub memory cell array 200, e.g., data stored in the memory cell transistors subsequently pass through the sub array column selector 50—sub data line—sense amplifier 30—sense amplifier output line L10, thereby being input to the data output multiplexer 120.

The sub memory cell array 200 has NAND cell strings, each of which has a predetermined number of memory cell transistors that is less than the number of memory cell transistors included in the NAND cell string of the main memory cell array 100, and the sub memory cell array 200 has metal lines L1 as shown in FIG. 4, thereby loading of the sub bit line is reduced relative to that of the main bit line and read operation is performed with a faster data sensing time than that of the main memory cell array 100.

In addition, since the operation speed of the sense amplifier 30 shown in FIG. 10 becomes faster than that shown in FIG. 8, a high-speed random access operation can be achieved. The data output multiplexer 120, the total number of which is 8, one every I/O, selects data output from the sense amplifier output line L10 during the data read operation to thereby output it to the common data output line Dout of 8 bits, thereby the random access of high speed, e.g., the data read operation of high speed can be achieved.

While the invention has been described in terms of preferred embodiments, those skilled in the art will recognize that the invention can be practiced with modification within the sprit and scope of the appended claims. For example, the structure of the sub memory cell array and the corresponding controller can be modified or changed in response to any required conditions. Specifically although the memory array has been shown as a specific size, it can be made any size still keeping within the concepts of the invention.

What is claimed is:

1. A nonvolatile semiconductor memory device, comprising:
a main memory cell array formed of a plurality of NAND cell strings, each cell string formed of a number of memory cell transistors;
a sub memory cell array, separate from the main memory cell array, and having a plurality of NAND cell strings each formed from a number of memory cell transistors, the number of the memory cell transistors in the cell strings of the sub memory cell array less than the number of memory cell transistors in the NAND cell strings of the main memory cell array, the sub memory cell array being operationally connected to main bit lines of the main memory cell array during program and erase operations, the sub memory cell array being electrically disconnected from the main bit lines during a read operation, and the sub memory array having a separate read path that is independent from a read path of the main memory cell array.

2. The device of claim 1, wherein the sub memory cell array comprises a plurality of sub array blocks, each sub array block comprises a plurality of I/O sub arrays, and each I/O sub array comprises a plurality of NAND cell strings.

3. The device of claim 2, wherein each I/O sub array is connected to a single word line.

4. The device of claim 2, wherein one of the NAND cell strings of the sub memory cell array comprises:
a first select transistor having a drain connected to a respective sub bit line, a source connected to a drain of a memory cell transistor having a floating gate, and having a gate connected to a string select line;
a second select transistor having a drain connected to a source of the memory cell transistor, a source connected to a common source line, and having a gate connected to a ground select line;
wherein the memory cell transistor is connected between the first and second select transistors.

5. The device of claim 1, wherein the sub memory cell array is capable of a random access data read that is faster than a data read in the main memory cell array.

6. The device of claim 1, wherein the sub memory cell array is capable of being stored with data that indexes data stored in the main memory cell array.

7. The device of claim 1, wherein a ROM table is stored within the sub memory cell array.

8. A memory cell array structure of a nonvolatile semiconductor memory comprising:
a first memory cell array having main array blocks formed with a plurality of I/O main arrays in turn formed of a plurality of NAND cell strings;
a second memory cell ray having a plurality of NAND cell strings, each cell string formed of a number of memory cell transistors, the number of the memory cell transistors in the second memory cell array less than a number of memory cell transistors in the NAND cell strings of the first memory cell array, the second memory cell array being operationally connected to main bit lines of the first memory cell array during program and erase operations, the second memory cell array being electrically disconnected from the main bit lines during a read operation, the second memory cell array having a separate read path that is independent from a read path of the first memory cell array, and the second memory cell array having a sensing time that is shorter than a sensing time in the first memory cell array during a read operation.

9. The structure of claim 8, wherein one of a read path of the first memory cell array and a read path of the second memory cell array is connected to a data output line by a data output multiplexer in response to a logic level of a multiplexing control signal.

10. The structure of claim 9, wherein at least one of the NAND cell strings of the second memory cell array comprises:

a first select transistor having a drain connected to a sub bit line, a source connected to a drain of a memory cell transistor having a floating gate, and a gate connected to a string select line;

a second select transistor having a drain connected to a source of the memory cell transistor, a source connected to a common source line, and a gate connected to a ground select line; and the memory cell transistor having a drain-source channel connected between the first and second select transistors, and having a control gate connected to a word line.

11. The structure of claim 10, wherein the ground select line is formed of or connected to a metal line having a higher electric conductivity than that of the word line.

12. The structure of claim 10, wherein the string select line is formed of or connected to a metal line having a higher electric conductivity than that of the word line.

13. An electrically programmable and erasable nonvolatile semiconductor memory device, comprising:

a main memory cell array having a plurality of main array blocks, each of the plurality of main array blocks including a plurality of NAND cell strings in which memory cell transistors are connected between string select transistors and ground select transistors that are respectively connected to a main bit line and a virtual ground, the NAND cell strings having two or more memory cell transistors connected to bit lines, the memory cell transistors having drain-source channels in series connected and each of the memory cell transistors having a control gate and a floating gate for storing data;

a sub memory cell array including sub array blocks having a plurality of NAND cell strings, each of the cell strings of the sub memory cell array including memory cell transistors, the number of the memory cell transistors being less than a number of the memory cell transistors in the NAND cell strings of the main memory cell arrays, the sub memory cell array being operationally connected to the main bit lines of the main memory cell array during program and erase operations, the sub memory cell array being electrically disconnected from the main bit lines during a read operation and having a separate read path that is independent from a read path of the main memory;

sub bit line selectors for selectively connecting sub bit lines to the main bit lines in response to a shutoff signal;

page buffers connected between the main bit lines and the main data lines to access data of selected memory cell transistors and to supply a program voltage to the main bit lines during a program operation;

sub array column selectors connected between the sub bit lines and sub data lines;

sense amplifiers connected to the sub data lines to access data of selected memory transistors in the sub memory cell array;

a virtual power controller for supplying a power supply voltage to the sub data lines;

a data output multiplexer for selectively outputting through a common output line data that are supplied to the sub data lines and the main data lines; and an input buffer for input-buffering data input from an external circuit during a program operation to supply it to the main data lines.

14. The device of claim 13, wherein the sub memory cell array comprises a plurality of sub array blocks, each sub array block comprises 8 I/O sub arrays, and each I/O sub array comprises a plurality of NAND cell strings.

15. The device of claim 14, wherein the I/O sub array is connected to a single word line.

16. The device of claim 14, wherein the NAND cell string of the sub memory cell array comprises:

a first select transistor having a drain connected to a sub bit line, a source connected to a drain of a memory cell transistor having a floating gate, and a gate connected to a string select line;

a second select transistor having a drain connected to a source of the memory cell transistor, a source connected to a common source line, and a gate connected to a ground select line;

wherein the memory cell transistor is connected to a word line at its control gate and the drain-source channel thereof is connected between the first and second select transistors.

17. The device of claim 13, wherein the sub memory cell array is operable during a random access tat requires a higher speed data read operation than in the main memory cell array.

18. The device of claim 13, wherein the sub memory cell array is capable of storing index data concerning data stored in the main memory cell array.

19. The device of claim 13, wherein the sub memory cell array is capable of storing ROM table information.

20. The device of claim 36, wherein the ground select line is formed of or connected to a metal line having a higher electric conductivity than that of the word line.

21. The device of claim 16, wherein the string select line is formed of or connected to a metal line having a higher electric conductivity than that of the word line.

22. A method of accessing a memory cell array of a nonvolatile semiconductor memory device having a main memory cell array formed of a plurality of NAND cell strings, and having a sub memory cell array including a plurality of NAND cell strings formed of memory cell transistors, a number of the memory cell transistors in the sub memory cell array being less than a number of memory cell transistors in the NAND cell strings of the main memory cell array, the method comprising:

performing a same program and erase operations in the sub memory cell array as in the main memory cell array by operationally connecting sub bit lines of the sub memory cell array to main bit lines of the main memory cell array during program and erase operations of the sub memory cell array; and performing a read operation with a shorter data sensing time than that of the main memory cell array by electrically disconnecting the sub bit lines from the main bit lines during a random access read operation of the sub memory cell array.

23. A NAND flash memory device, comprising:

a main memory cell array having a plurality of main array blocks having provided therein a plurality of NAND cell strings in which memory cell transistors are connected between string select transistors and ground select transistors that are respectively connected to a main bit line and a virtual ground, the NAND cell strings having two or more memory cell transistors connected to bit lines in which drain-source channels are in series connected, each memory cell transistor having a control gate and a floating gate for storing data, the control gates of the memory cell transistors being connected to a respective plurality of word lines, and the drains of the string select transistors being connected to a plurality of bit lines crossed with the word lines;

a sub memory cell array provided with sub array blocks having a plurality of NAND cell strings in which is provided therein memory cell transistors, a number of the memory cell transistors in the sub memory array being less than a number of the memory cell transistors in the NAND cell strings of the main memory cell array, the sub memory cell array being operationally connected to the main bit lines of the main memory cell array during program and erase operations, the sub memory cell array being electrically disconnected from the main bit lines during a read operation, and the sub memory cell array having a separate read path that is independent from a read path of the main memory, the sub memory cell array having a faster sense time than in the main memory cell array during a read operation;

accessing means for accessing data of the main and sub memory cell arrays; and common output means for selectively outputting one of the data outputted from the accessing means.

24. An electrically programmable and erasable nonvolatile semiconductor memory device, comprising:

a plurality of NAND cell strings in which one or a plurality of memory cells having a control gate and a floating gate are coupled so that their channels are in series connected, the memory cells being in series connected to a bit line and a virtual ground through string select means and ground select means, respectively;

a plurality of word lines respectively coupled to control gates of the plurality of NAND cell strings;

a plurality of NAND cell blocks having bit lines;

a NAND cell array in which the plurality of NAND cell blocks is coupled to respective bit lines;

a NAND cell main array having a same structure as the NAND cell array;

a NAND cell sub array having NAND cell blocks, the number of the NAND cell blocks being fewer than tat of the NAND cell blocks in the NAND cell main array;

sub bit line select means for connecting or disconnecting bit lines to each of the two arrays;

a page buffer connected to a bit line of the NAND cell main ray to thereby read a state of a memory cell and supply a program voltage to the bit line during a program operation;

a sub array column selector connected to a bit line of the NAND cell sub array to thereby select all or a portion of the plurality of bit lines of the NAND cell sub array so that the selected bit line is connected to a separate circuit;

a sense amplifier for reading a cell state of the bit lines selected through the sub array column selector; and a virtual power controller for providing a power supply voltage to the bit lines selected through the sub array column selector.

25. The device of claim 24, wherein a main bit line is structured to be electrically connected to a sub bit line by the sub bit line select means during a programming of the NAND cell sub array.

26. The device of claim 25, wherein the main bit line is electrically disconnected from the sub bit line by the sub bit line select means during a read operation of the NAND cell sub array.

27. The device of claim 26, wherein the NAND cell block within the NAND cell sub array is connected to one word line.

28. The device of claim 24, wherein the string select means of the NAND cell block within the NAND cell sub array is applied with a signal through one or more connection means having an electric resistance less than that of the word line.

29. The device of claim 24, wherein a word line voltage during a non-operational state of the NAND cell sub array is applied at a lower level than tat of a threshold voltage of the NAND cell at an off-state, and wherein a voltage applied to the ground select means is applied at a level as much tat the ground select means can be turned-on.

30. The device of claim 27, wherein the ground select means of the NAND cell block within the NAND cell sub array is applied with a signal through one or more connection means having an electric resistance less than that of the word line.

31. The device of claim 24, wherein a word line voltage during the non-operational state of the NAND cell sub array is applied at a lower level than that of the threshold voltage of the NAND cell at an off-state, and wherein the voltage applied to the string select means is applied at a level as much that the ground select means can be turned-on.

32. The device of claim 28, wherein the select line is coupled to the connection means at three or more connection portions thereof.

33. The device of claim 32, wherein the connection portions are divided by the I/O array unit.

* * * * *

UNITED STATES PATENT AND TRADEMARK OFFICE
CERTIFICATE OF CORRECTION

PATENT NO. : 6,678,191 B2
DATED : January 13, 2004
INVENTOR(S) : Lee et al.

Page 1 of 1

It is certified that error appears in the above-identified patent and that said Letters Patent is hereby corrected as shown below:

Column 12,
Line 44, "cell ray having" should read -- cell array having --.

Column 14,
Line 21, "access tat requires" should read -- access that requires --.
Line 29, "claim 36, wherein" should read -- claim 16, wherein --.

Column 15,
Line 42, "than tat of" should read -- than that of --.
Line 47, "main ray to" should read -- main array to --.

Column 16,
Line 28, "than tat of" should read -- than that of --.
Line 30, "much tat the" should read -- much that the --.

Signed and Sealed this

Sixth Day of July, 2004

JON W. DUDAS
*Acting Director of the United States Patent and Trademark Office*